(12) United States Patent
Pan

(10) Patent No.: US 8,541,840 B2
(45) Date of Patent: Sep. 24, 2013

(54) STRUCTURE AND METHOD FOR SEMICONDUCTOR POWER DEVICES

(75) Inventor: James Pan, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 135 days.

(21) Appl. No.: 13/028,054

(22) Filed: Feb. 15, 2011

(65) Prior Publication Data
US 2011/0133275 A1 Jun. 9, 2011

Related U.S. Application Data

(62) Division of application No. 12/109,293, filed on Apr. 24, 2008, now Pat. No. 7,910,995.

(51) Int. Cl.
*H01L 27/12* (2006.01)

(52) U.S. Cl.
USPC .................................. 257/347; 257/E27.112

(58) Field of Classification Search
USPC .............. 257/336, 378, E27.015, 347, 348, 257/350, 351, E27.112, E29.117, E29.119, 257/E29.261
See application file for complete search history.

(56) References Cited

U.S. PATENT DOCUMENTS

| | | | |
|---|---|---|---|
| 4,962,054 A | 10/1990 | Shikata | |
| 5,504,358 A | 4/1996 | Hong | |
| 5,567,629 A | 10/1996 | Kubo | |
| 5,686,755 A * | 11/1997 | Malhi | 257/492 |
| 5,930,642 A * | 7/1999 | Moore et al. | 438/407 |
| 7,061,057 B2 | 6/2006 | Babcock et al. | |
| 7,316,941 B1 * | 1/2008 | Gupta | 438/133 |
| 7,489,008 B1 | 2/2009 | Lee et al. | |
| 2002/0030238 A1 * | 3/2002 | Nakamura et al. | 257/409 |
| 2003/0062539 A1 * | 4/2003 | Chatterjee | 257/199 |
| 2004/0031998 A1 * | 2/2004 | Chen et al. | 257/409 |
| 2004/0164354 A1 * | 8/2004 | Mergens et al. | 257/355 |
| 2005/0230747 A1 * | 10/2005 | Suzuki et al. | 257/330 |
| 2006/0011981 A1 | 1/2006 | Lee | |
| 2006/0043494 A1 | 3/2006 | Ipposhi et al. | |
| 2006/0095873 A1 | 5/2006 | Kaya | |
| 2007/0013008 A1 | 1/2007 | Xu et al. | |
| 2007/0034942 A1 | 2/2007 | Xu et al. | |
| 2007/0034944 A1 | 2/2007 | Xu et al. | |
| 2007/0138548 A1 | 6/2007 | Kocon et al. | |
| 2007/0207600 A1 * | 9/2007 | You et al. | 438/527 |
| 2009/0267146 A1 | 10/2009 | Pan | |

OTHER PUBLICATIONS

Requirement for Restriction/Election for U.S. Appl. No. 12/109,293, mailed on Oct. 28, 2009, 9 pages.
Non-Final Office Action for U.S. Appl. No. 12/109,293, mailed on Dec. 11, 2009, 20 pages.
Final Office Action for U.S. Appl. No. 12/109,293, mailed on Jun. 17, 2010, 22 pages.
Final Office Action for U.S. Appl. No. 12/109,293, mailed on Sep. 3, 2010, 27 pages.
Notice of Allowance for U.S. Appl. No. 12/109,293, mailed on Nov. 15, 2010, 5 pages.

* cited by examiner

*Primary Examiner* — Vongsavanh Sengdara

(57) ABSTRACT

A semiconductor device includes a semiconductor-on-insulator region on a substrate. The semiconductor-on-insulator region includes a first semiconductor region overlying a dielectric region. The device includes an MOS transistor and a bipolar transistor. The MOS transistor has a drain region, a body region, and a source region in the first semiconductor region. The MOS transistor also includes a gate. The device also includes a second semiconductor region overlying the substrate and adjacent to the drain region, and a third semiconductor region overlying the substrate and adjacent to the second semiconductor region. The bipolar transistor includes has the drain region of the MOS transistor as an emitter, the second semiconductor region as a base, and the third semiconductor region as a collector. Accordingly, the drain of the MOS transistor also functions as the emitter of the bipolar transistor. Additionally, the gate and the base are coupled by a resistive element.

22 Claims, 6 Drawing Sheets

STRUCTURE AND METHOD FOR SEMICONDUCTOR POWER DEVICES

CROSS-REFERENCES TO RELATED APPLICATIONS

The present application is a division of U.S. application Ser. No. 12/109,293, filed on Apr. 24, 2008 entitled "Structure And Method For Semiconductor Power Devices," the content of which is incorporated herein by reference in its entirety.

BACKGROUND OF THE INVENTION

The present invention relates in general to semiconductor power devices. More particularly, the invention provides structures and methods for a high voltage laterally diffused metal oxide semiconductor (LDMOS) device.

High voltage LDMOS transistors are finding increasingly broad applications in modern electronics, such as portable consumer electronics, power management circuits, automotive electronics, disk drives, display devices, RF communication circuits, and wireless base station circuits, etc. In these applications, the performance of an LDMOS transistor is usually measured by its on-resistance, switching speed, and breakdown voltage.

FIG. 1 is a cross-sectional view of a conventional high voltage LDMOS transistor 100. An $n^-$-type well region 12 is formed on an n-type substrate 10. A $p^-$-type body region 13 is formed in $n^-$-type well region 12. An $n^+$-type source region 15 and an n-type lightly doped source region 16 are formed in $p^-$-type body region 13. An n-type lightly doped drain region 18 is formed in $n^-$-type well region 12.

A gate insulating layer 20 extends over $n^-$-type well region 12 and a surface portion of p-type body region 13. A gate conductive layer 21 extends over gate insulating layer 20. A source electrode 23 is in contact with $n^+$-type source region 15 and p-type body region 13. An $n^+$-type sinker region 20 connects the n-type lightly doped drain region 18 with the $n^+$-type substrate 10, which is used as a drain electrode.

Upon applying a reverse bias across the drain-source electrodes, a depletion region extends out from the junction between p-type body region 13 and n-type well region 12, as shown by the arrow 32. High electric fields tend to build up in the depletion region, and breakdown occurs when the electric fields exceed certain limitations. When device 100 is turned on, the current flows from the drain region 10 through the sinker region and channel region to the source electrode 23. This current path often introduces a high on-resistance Rdson. Additionally, the charges in the well region and the body region can limit the switching speed of the device, when a gate voltage is applied to turn on and off the device.

Even though conventional LDMOS devices, such as device 100 in FIG. 1, are satisfactory in certain applications, they suffer from many limitations. These limitations include low breakdown voltage, high on-resistance, and excess gate charges that impact device switching speed.

Thus, there is a need for improved LDMOS device structures and cost-effective manufacturing methods that offer reduced on-resistance, higher breakdown voltage, and lower gate charges.

BRIEF SUMMARY OF THE INVENTION

In accordance with embodiments of the present invention, a composite semiconductor device includes an MOS transistor built in an SOI layer combined with a bipolar transistor. The drain of the MOS transistor also forms the emitter of the bipolar transistor, and the base of the bipolar transistor is coupled to the gate of the MOS transistor by a resistive element. In an embodiment, the MOS transistor is an LDMOS built in SOI for power applications. Depending on the embodiment, the composite device can provide reduced on-resistance, higher breakdown voltage, and lower gate charges. In one embodiment, part of the bipolar transistor is built in a vertical semiconductor region connecting a front side semiconductor layer of the SOI with a back side substrate. Additionally, a method for forming the composite device is provided.

According to a specific embodiment, a semiconductor device includes a semiconductor-on-insulator (SOI) region on a substrate. The semiconductor-on-insulator region includes a first semiconductor region overlying a dielectric region. The device includes an MOS transistor and a bipolar transistor. The MOS transistor has a drain region, a body region, and a source region in the first semiconductor region. The MOS transistor further includes a gate. The device also includes a second semiconductor region overlying the substrate and adjacent to the drain region, and a third semiconductor region overlying the substrate and adjacent to the second semiconductor region. The bipolar transistor includes the drain region of the MOS transistor as an emitter, the second semiconductor region as a base, and the third semiconductor region as a collector. Additionally, the gate and the base are coupled by a resistive element.

In an embodiment, the MOS transistor is an LDMOS built using an SOI layer, and the LDMOS is combined with the bipolar transistor to form a an SOI lateral diffused bipolar MOS (LDBiMOS) device. In a specific embodiment, part of the bipolar transistor is built in a vertical semiconductor region connecting a front side semiconductor layer of the SOI with a back side substrate.

In a specific embodiment, the MOS transistor is an NMOS transistor and the bipolar transistor is an NPN bipolar transistor. In another embodiment, the MOS transistor is a PMOS transistor and the bipolar transistor is a PNP bipolar transistor.

In accordance with another embodiment of the present invention, a method for forming a semiconductor device includes providing a semiconductor-on-insulator layer on a semiconductor substrate of a first conductivity type. The semiconductor-on-insulator layer includes a semiconductor layer overlying a dielectric layer. The method includes forming a void in the semiconductor-on-insulator layer to expose a portion of the substrate, and then forming a first semiconductor region to fill the void. That is, the first semiconductor region provides a region of semiconductor material that is in contact with both the semiconductor layer and the substrate. The method also includes forming an MOS transistor and a bipolar transistor. The MOS transistor includes a drain region, a source region, and a body region in the semiconductor layer. The MOS transistor also has a gate which is separated from the body region by a gate dielectric. The bipolar transistor includes the drain region as an emitter, an upper portion of the first semiconductor region as a base, and a lower portion of the first semiconductor region as a collector. Then a resistive element is formed overlying the semiconductor substrate and is coupled to the base and to the gate.

In an embodiment, three electrodes are formed for the semiconductor device: a first electrode coupled to the source region, a second electrode coupled to the substrate, and a third electrode coupled to the base which is also coupled to the gate through the resistive element.

In a specific embodiment the void is formed by removing a portion of the first semiconductor layer and a portion of the underlying dielectric layer. In an embodiment, the first semiconductor region is epitaxially grown to fill the void in the semiconductor-on-insulator layer.

In another embodiment of the method, the process of forming the bipolar transistor includes forming a first doped region of the first conductivity type in the lower portion of the first semiconductor region that fills the void, and forming a second doped region of second conductivity type in the upper portion of the first semiconductor region. The second doped region is adjacent to the drain region, such that the second doped region can function as the base region of the bipolar transistor. Depending on the embodiment, the different doped regions in the MOS and bipolar transistors can be formed in a variety of sequences. For example, the collector in the lower portion of the semiconductor region in the void can be doped first followed by a drive-in diffusion cycle.

In accordance with an alternative embodiment, a semiconductor device includes a semiconductor substrate of a first conductivity type, a dielectric layer overlying the semiconductor substrate, and a first semiconductor region overlying the dielectric layer. The device also includes an MOS transistor and a bipolar transistor. The MOS transistor includes a source region of the first conductivity in the first semiconductor region, a drain region of the first conductivity type in the first semiconductor region, and a body region of a second conductivity type between the drain region and the source region in the first semiconductor region. Here, the second conductivity type is understood to be opposite to the first conductivity type. For example, if the first conductivity type is n-type, then the second conductivity type is p-type, or vice versa. The MOS transistor also includes a gate extending over a surface portion of the body region, which forms a channel region of the MOS transistor. The device also includes a second semiconductor region of the second conductivity type overlying the semiconductor substrate, and a third semiconductor region of the first conductivity type overlying the second semiconductor region. The third semiconductor region is adjacent to the drain region of the MOS transistor. In an embodiment, the bipolar transistor has the drain region as an emitter, the third semiconductor region as a base, and the second semiconductor region as a collector. Additionally, the base and the gate are connected by a resistive element.

Many benefits are achieved over conventional techniques. For example, in an embodiment, a structure and method for forming a composite semiconductor device combining an MOS transistor built in an SOI layer with a bipolar transistor are provided. Depending on the embodiment, various features of the composite device include reduced on-resistance, higher breakdown voltage, or lower gate charges. Depending upon the embodiment, one or more of these benefits may be achieved. Additionally, a disclosed process embodiment is compatible with conventional process technology and would not require substantial modifications to the manufacturing processes or equipment. These and other benefits will be described in more detail throughout the present specification.

Various additional objects, features, and advantages of the present invention can be more fully appreciated with reference to the detailed description and accompanying drawings that follow.

DETAILED DESCRIPTION OF THE INVENTION

Figure 1:
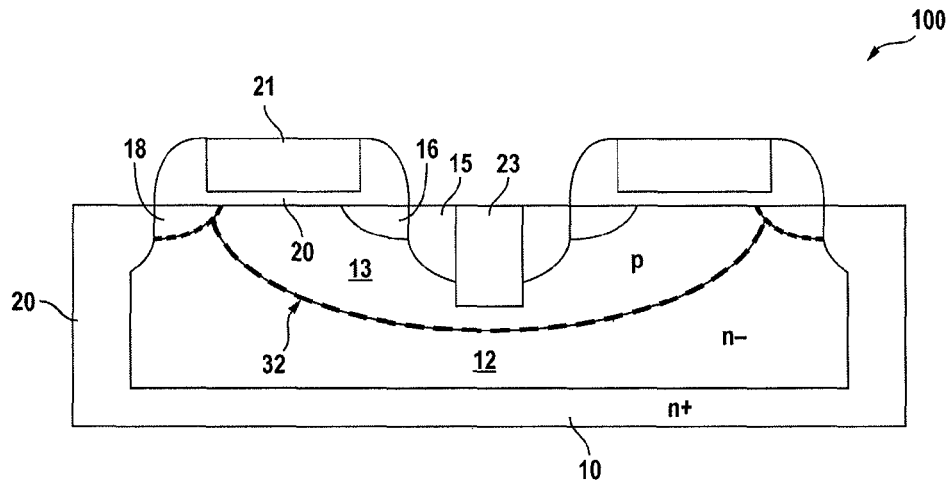
FIG. 1 is a cross-sectional view of a conventional high voltage laterally diffused metal oxide semiconductor (LDMOS) transistor.

As discussed above, even though LDMOS is widely used in power applications, conventional LDMOS suffers from many limitations. For example, the gate charge can be high due to the relatively large depletion regions. Also, the breakdown voltage BVdss for LDMOS is usually limited by the p-n junctions. Additionally, Rdson in the conventional LDMOS as shown in FIG. 1 tends to be high because the current flows through a 90° path, first laterally along a surface region and then vertically into the drain at the back side of the substrate. Thus, it is desirable for LDMOS device structures and cost-effective manufacturing methods that offer improved device performance.

In accordance with embodiments of the present invention, a composite semiconductor device is provided that includes an MOS transistor built in an SOI layer combined with a bipolar transistor. The drain of the MOS transistor also forms the emitter of the bipolar transistor, and the base of the bipolar transistor is coupled to the gate of the MOS transistor by a resistive element. In an embodiment, the MOS transistor is an LDMOS built in SOI for power applications. Depending on the embodiment, the composite device can provide reduced on-resistance, higher breakdown voltage, and lower gate charges. In one embodiment, part of the bipolar transistor is built in a vertical semiconductor region connecting a front side semiconductor layer of the SOI with a back side substrate. Additionally, the invention also provides a method for forming the composite device.

Figure 2A:
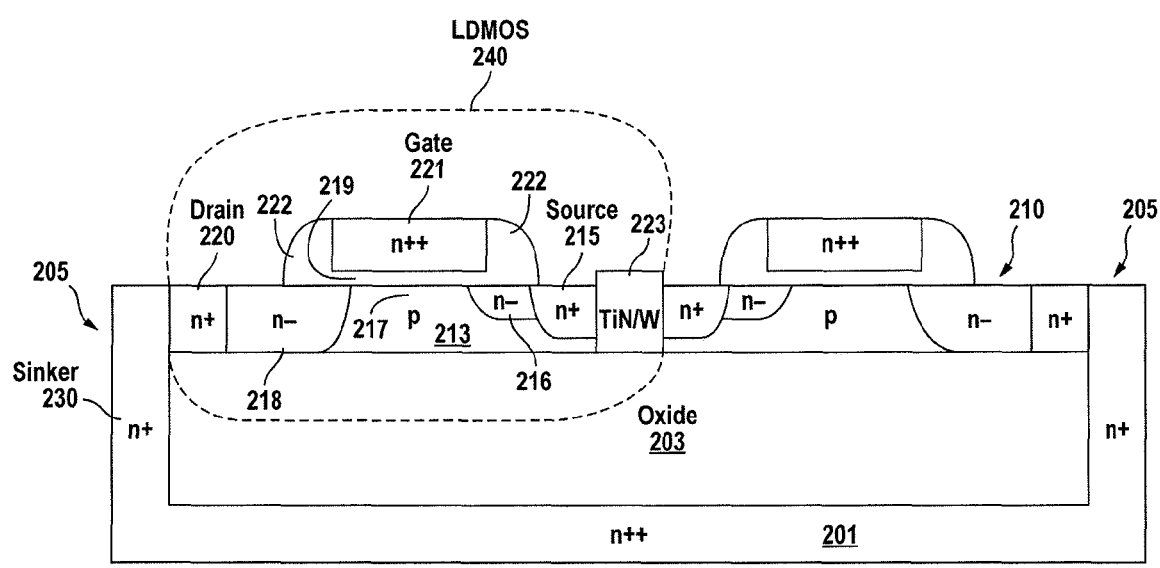
FIG. 2A shows a simplified cross-sectional view of a lateral diffused MOS transistor (LDMOS) on SOI according to an embodiment of the present invention.

FIG. 2A shows a simplified cross-sectional view of a lateral diffused MOS transistor (LDMOS) on SOI according to an embodiment of the present invention. As shown, LDMOS transistor 240 includes a semiconductor substrate 201. A dielectric layer 203 overlies the semiconductor substrate. A semiconductor layer 210 overlies the dielectric region 203. In this specific embodiment, substrate 201 is heavily doped n-type which functions as a back side electrode. As shown, LDMOS 240 includes an MOS transistor, which includes an n-type source region 225, n-type drain region 220, and a p-type body region 213 in the semiconductor layer 210. The body region 213 is located between the drain region and the source region. A gate 221 extends over a surface portion 217 of the body region. The surface portion 217 of the body region forms a channel region of the MOS transistor.

A gate insulating layer 219 extends over the surface portion 217 of p-type body region 213. A gate conductive layer 221 extends over gate insulating layer 225. A source electrode 223 is in contact with n+-type source region 215 and p-type body region 213. Additionally, in this specific embodiment, an n-type lightly doped drain region 218 is located between the drain region 220 and the body region 213, and a lightly doped source region 216 is located between the source region 215 and the body region 213. In an embodiment, the n-type lightly doped drain region 218 is extended for sustaining high voltage in power device applications. A heavily doped n-type sinker region 230 connects the drain region 820 with the semiconductor substrate 201 to form a drain contact in the back side of the device.

Figure 2B:
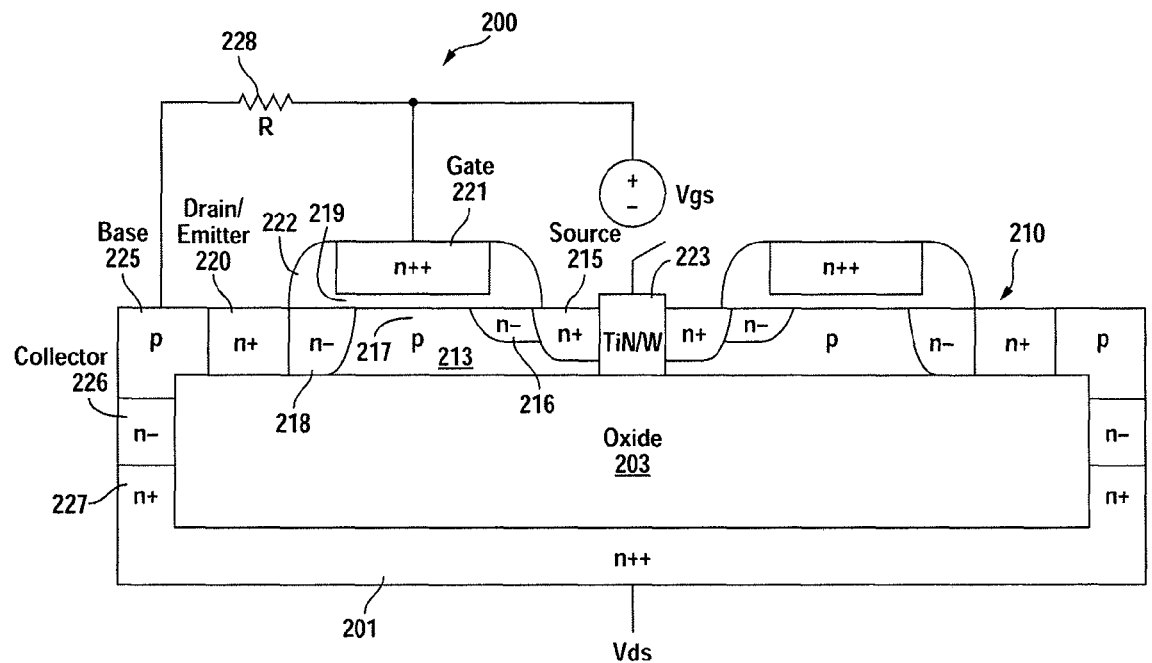
FIG. 2B shows a simplified cross-sectional view of a lateral diffused bipolar MOS (LDBiMOS) transistor according to another embodiment of the present invention.

FIG. 2B shows a simplified cross-sectional view of a lateral diffused bipolar MOS (LDBiMOS) transistor 200 according to another embodiment of the present invention. This diagram is merely an example, which should not unduly limit the scope of the claims herein. One of ordinary skill in the art would recognize other variations, modifications, and alternatives. As shown, LDBiMOS transistor 200 includes a semiconductor substrate 201. A dielectric layer 203 overlies the semiconductor substrate. A semiconductor layer 210 overlies the dielectric region 203. In this specific embodiment, substrate 201 is heavily doped n-type which can function as a back side electrode. As shown, LDBiMOS transistor 200 includes an MOS transistor, which includes an n-type source region 225, n-type drain region 220, and a p-type body region 213 in the semiconductor layer 210. The body region 213 is located between the drain region and the source region. A gate 221 extends over a surface portion 217 of the body region. The surface portion 217 of the body region forms a channel region of the MOS transistor.

A gate insulating layer 219 extends over the surface portion 217 of p-type body region 213. A gate conductive layer 221 extends over gate insulating layer 225. A source electrode 223 is in contact with n+-type source region 215 and p-type body region 213. Additionally, in this specific embodiment, an n-type lightly doped drain region 218 is located between the drain region 220 and the body region 213, and a lightly doped source region 216 is located between the source region 215 and the body region 213.

In FIG. 2B, a p-type base region 225 is located adjacent the drain region 220. An n-type collector region 226 is adjacent to the base region. The collector region 226 also overlies n-type region 227 over the semiconductor substrate 201. The emitter region 220, the base region 225, and the collector region 226 form a bipolar transistor. In this embodiment, the drain region 220 also functions as an emitter region of the bipolar transistor. In FIG. 2B, the collector region 226 is coupled, through n+ region 227, to the heavily doped substrate 201, which can be used as a back side terminal.

As shown in FIG. 2B, a resistive element 228 is coupled between the gate 221 and the base region 225. In a specific embodiment, the resistive element 228 can be a conventional resistor formed on the substrate. For example, the resistor can be a diffused resistor, a polysilicon resistor, or metal resistor, depending on the embodiment. The resistive element 228 is coupled to the gate and base region via interconnects formed on the substrate.

Figure 3:
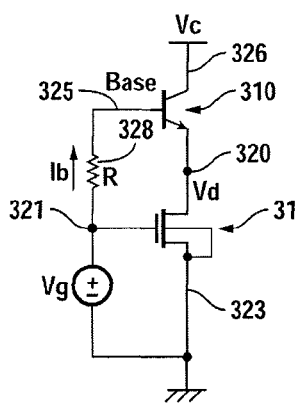
FIG. 3 is a simplified schematic diagram illustrating the lateral diffused bipolar MOS (LDBiMOS) device 200 of FIG. 2B.

FIG. 3 is a simplified schematic diagram for the lateral diffused bipolar MOS transistor (LDBiMOS) device 200 of FIG. 2B. According to a specific embodiment of the invention, device 300 may be similar to device 200 of FIG. 2B. As shown in FIG. 3, device 300 includes a bipolar transistor 310 in series with an MOS transistor 312. The bipolar transistor 310 includes collector 326, base 325, and emitter 320, whereas the MOS transistor includes drain 320, source 323, and gate 321. As shown, the emitter 320 of the bipolar device is also the drain of the MOS transistor. Additionally, the base 325 of the bipolar transistor is coupled to the gate 321 of the bipolar transistor through a resistor 328.

In FIG. 3, the collector terminal 326 is coupled to a supply voltage Vc. The source terminal 323 is coupled to a ground voltage. The gate terminal 321 is coupled to an applied gate voltage Vg. The base terminal 325 is coupled to the applied voltage Vg through resistor 328. According to an embodiment, the operation of device 300 can be described as follows. When a gate voltage Vg is applied, the MOS transistor 312 is turned on, forcing the drain voltage Vd to be low. Part of the gate voltage Vg also appears at the base 325 of bipolar transistor 310. Since the drain terminal 320 is also the emitter terminal for the bipolar transistor, this in turn causes the base-emitter junction to be forward biased. As a result, the bipolar transistor 310 is turned on.

In FIG. 3, device 300 can be viewed as a three-terminal power device with three applied voltages: power supply Vc at the collector terminal 326, input signal Vg at the gate terminal 321, and a ground voltage at the source terminal 323. As a power transistor, device 300 can be characterized by power device parameters such as on-resistance Rdson, breakdown voltage BVdss, and gate charge Qgs. According to embodiments of the invention, the composite device 300 can provide improved device performance. The silicon-on-insulator region reduces the depletion regions and the associated junction capacitances, resulting in lower gate charge and higher breakdown voltage. The combination of the MOS and bipolar structures provides increased current flow and therefore reduces Rdson. Therefore, device 300 is capable of providing lower on-resistance, higher breakdown voltage, and lower gate charge, compared to a conventional LDMOS. The improved device performance has been confirmed in our simulation studies, as discussed below.

Figure 4:
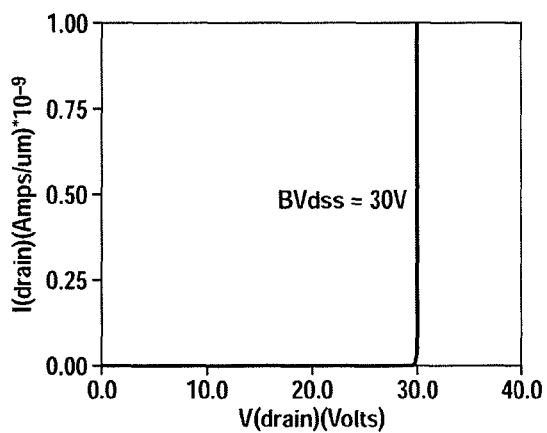
FIG. 4 is a simplified graph showing the simulated breakdown voltage BVdss characteristics of a lateral diffused bipolar MOS (LDBiMOS) device according to an specific embodiment of the present invention.

FIG. 4 is a simplified graph showing the simulated breakdown voltage BVdss characteristics of a lateral diffused bipolar MOS transistor according to a specific embodiment of the present invention. As shown, the BVdss is about 30 V. In comparison, a convention LDMOS may have a BVdsss of about 14-15 V. Thus, the composite device has a breakdown voltage almost twice as high as that of a conventional device.

Figure 5:
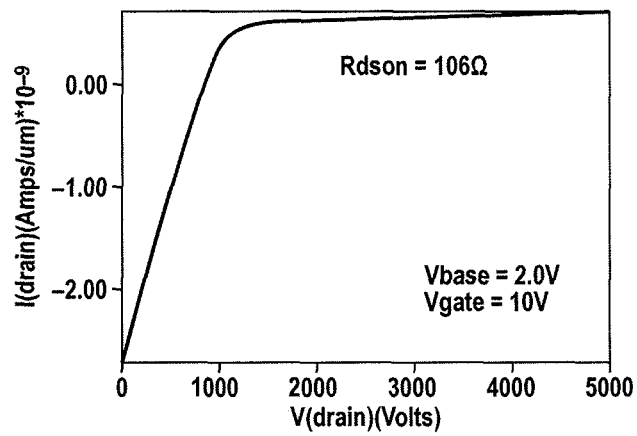
FIG. 5 is a simplified graph showing the simulated drain current versus drain voltage characteristics of the lateral diffused bipolar MOS transistor (LDBiMOS) device of FIG. 4.

FIG. 5 is a simplified graph showing the simulated drain current versus drain voltage characteristics of the lateral diffused bipolar MOS (LDBiMOS) transistor of FIG. 4. With the bias voltage 2.0 V at the base and 10 V at the gate, the Rdson is about 106 ohms, as shown in FIG. 4. In contrast, a convention LDMOS may have an Rdson of about 3K ohms. Therefore, Rdson of 106 ohms provided by the LDBiMOS is approximately 30 times lower.

Figure 6:
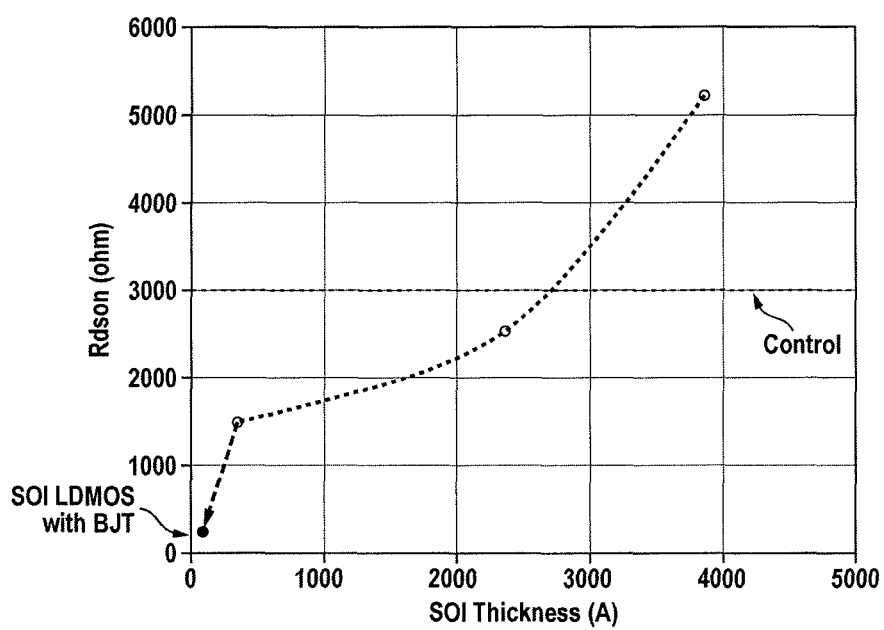
FIG. 6 is a simplified graph comparing the simulated on-resistance Rdson for various lateral diffused MOS transistors according to an embodiment of the present invention.

FIG. 6 is a simplified graph comparing the simulated on-resistance Rdson for various lateral diffused MOS transistors (LDMOS) according to an embodiment of the present invention. In FIG. 6, the dotted line labeled "control" indicates an Rdson of approximately 3K ohms for a conventional LDMOS. The open circles denote the on-resistances of LDMOS devices formed in silicon-on-insulator (SOI) structures, such as device 240 in FIG. 2A. In these LDMOS devices, the MOS transistor is formed in the silicon layer overlying an oxide region, with a sinker region connects the drain to the back side terminal. As can be seen, the Rdson decreases with thinner top layer of silicon in the SOI structure. Further improvement can be achieved in an LDBiMOS device which includes a bipolar transistor structure to an LDMOS device built using an SOI structure, such as device 200 of FIG. 2B. As shown by the solid circle, the LDBiMOS achieves a much lower Rdson of about 106 ohms.

Figure 7:
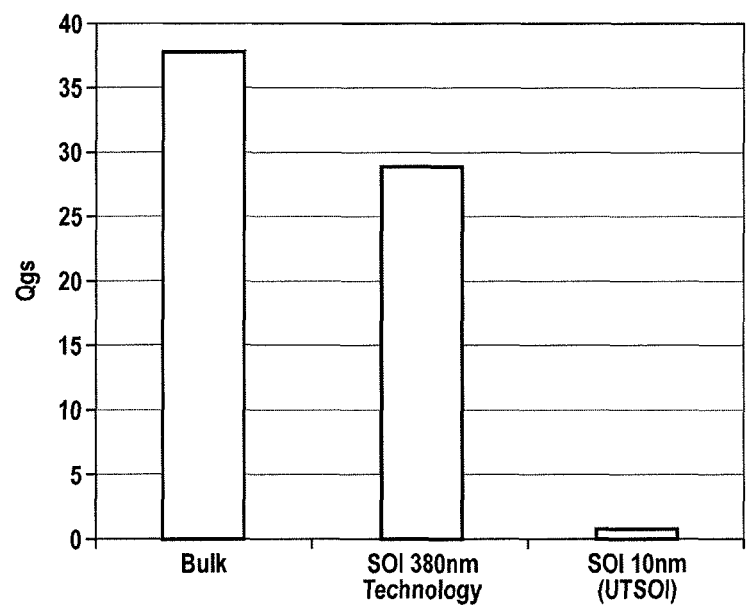
FIG. 7 is a simplified graph comparing the simulated gate charge Qgs for various lateral diffused MOS transistors according to an embodiment of the present invention.

FIG. 7 is a simplified graph comparing the simulated gate charge Qgs for various lateral diffused MOS (LDMOS) transistors according to an embodiment of the present invention. As shown, an LDMOS built in a bulk substrate has the highest Qgs, followed by an LDMOS built on a 380 nm-thick SOI layer. In comparison, an LDBiMOS with a 10 nm-thick SOI exhibits by far the lowest Qgs. Since a low Qgs is associated with a fast device switching speed, the LDBiMOS can achieve a higher switching speed.

Thus, according to some embodiments of the present invention, forming an LDMOS device on an SOI structure can reduce the on-resistance Rdson. The reduction in Rdson is more pronounced when the silicon layer of the SOI is relatively thin, as shown in FIG. 6. Additionally, the Rdson and Qgs are further reduced in an LDBiMOS device that combines an LDMOS on SOI and a bipolar transistor.

Although the above has been shown using a selected group of components for the composite device LDBiMOS, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

Figure 8A:
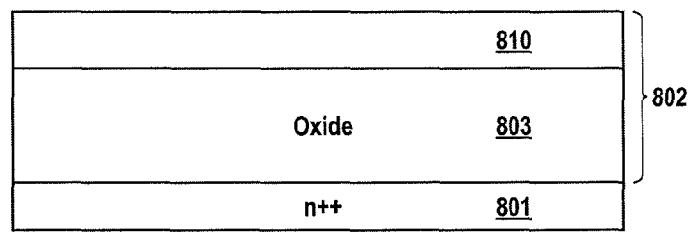
FIGS. 8A through 8F are simplified cross-sectional views illustrating a method for manufacturing a lateral diffused bipolar MOS transistor according to an embodiment of the present invention.

FIGS. 8A through 8E are simplified cross-sectional view diagrams illustrating a method for manufacturing a lateral diffused bipolar MOS (LDBiMOS) device according to an embodiment of the present invention. These diagrams are merely examples, which should not unduly limit the scope of the claims herein. One skilled in the art would recognize other variations, modifications, and alternatives. As shown in FIG. 8A, the method includes providing a semiconductor-on-insulator (SOI) layer 802 on a semiconductor substrate 801 of a certain conductivity type. The semiconductor-on-insulator layer 802 includes a semiconductor layer 810 overlying a dielectric layer 803. In a specific embodiment, substrate 801 is a heavily doped n-type silicon substrate. In a specific embodiment, the SOI layer 802 includes a layer of silicon 810 overlying a layer of silicon oxide. Depending on the embodiment, the SOI layer may be formed by a variety of known methods, such as recrystalization, oxygen implant, or other methods involving bonding and/or cleaving, etc.

Figure 8B:
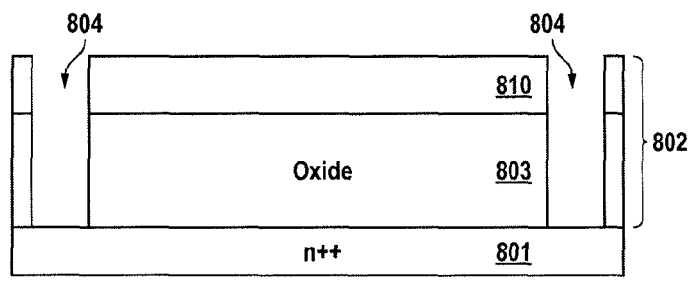

In FIG. 8B, a void 804 is formed in the SOI layer 802 to expose a portion of the substrate 801 at the bottom of the void. The void can be made by masking, etching the silicon layer 810, and then etching the oxide layer 803. Here, the masking and etching steps can be carried out using conventional processes.

Figure 8C:
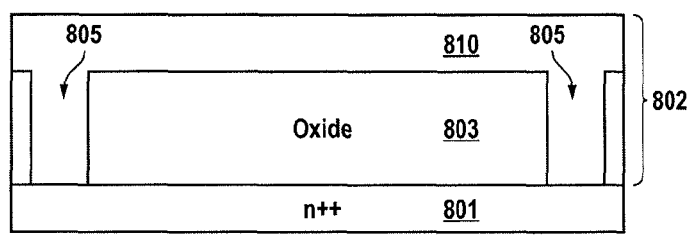

In FIG. 8C, a silicon region 805 is formed to fill the void. In a specific embodiment, the silicon region 805 can be formed using an epitaxial growth process, while the silicon region outside the void can be protected by a dielectric layer, such as silicon oxide or silicon nitride (not shown). As shown, the silicon region 805 provides a region of semiconductor material that is in contact with both the semiconductor layer 810 and the substrate 801. With the device structure in FIG. 8C, further processing can be carried out to form either an LDMOS on SOI (e.g. FIG. 2A) or an LDBiMOS (e.g. FIG. 2B).

Figure 8D:
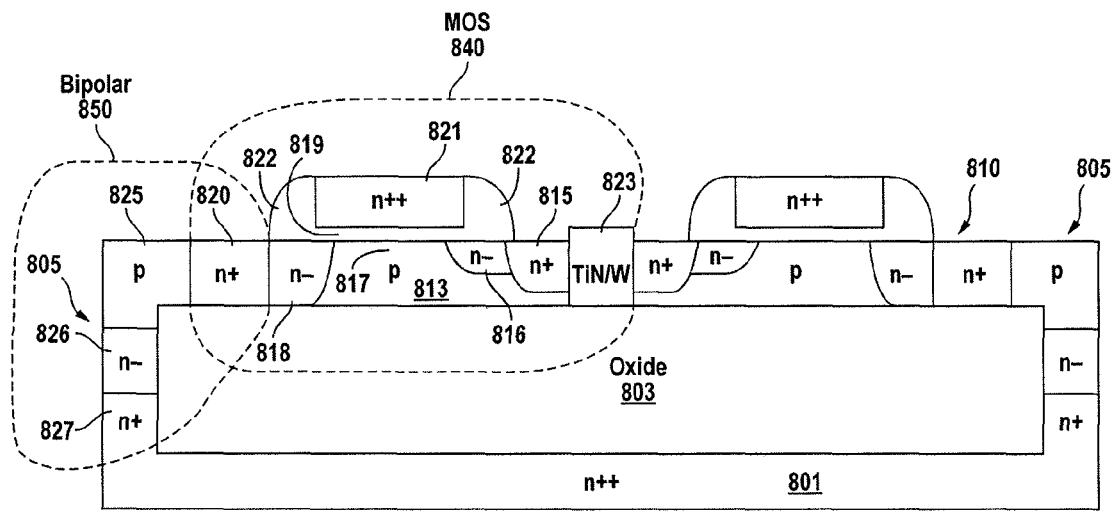

In FIG. 8D, an LDBiMOS is formed, which includes an MOS transistor 840 and a bipolar transistor 850 are formed. The device structures in FIG. 8D have similar features as those in FIG. 2B. For example, the MOS transistor 840 includes a drain region 820, a source region 815, and a body region 813 in the semiconductor layer 810. The MOS transistor also has a gate 821 which is separated from the body region 813 by a gate dielectric 819. The bipolar transistor 850 includes an emitter 820, a base 825, and a collector 826. As shown, n+ region 820 functions as both a drain region for the MOS transistor and an emitter region for the bipolar transistor. The base 825 is in an upper portion of the silicon region 805, whereas the collector 826 is in a lower portion 826 of the silicon region 805.

Depending on the embodiment, the MOS transistor 840 and the bipolar transistor 850 can be formed using various known processes. In particular, the doped regions can be formed using masked or unmasked implantation processes, which can be followed by appropriate diffusion steps if necessary. Additionally, either the bipolar transistor or the MOS transistor can be formed first, and the various device regions can be formed in different orders.

In a specific embodiment, the MOS transistor can be formed by first forming an n-type well region (not shown) in the semiconductor layer 810, followed by the formation of the gate dielectric 819 overlying the well region. Next, polysilicon gate 821 is formed overlying the gate dielectric 819 and then patterned using conventional processes. The lightly doped drain, spacers, and source and drain regions can be formed using conventional processes. In FIG. 8D, a mask process is used to form the asymmetric lightly doped drain region 818 and the lightly doped source region 816. Similarly, a masking process is used to form the asymmetric drain region 820 and source region 815. In a specific In an alternative embodiment, the MOS transistor can be formed using a laterally-diffused process. First, an implant and drive-in processes is used to form the p-type body region 813 in the n-well region and further extending under the gate. A long lightly doped drain (LDD) region 818 is also defined in this step. Subsequently, lightly doped source region 816, spacers 822, source region 815, and drain region 820 can be formed using conventional methods. Of course, there can be other variations or modifications.

In an embodiment, the collector region 826 and the base region 825 of the bipolar transistor can be formed using conventional patterning, implantation, and drive-in diffusion processes. In FIG. 8D, the n+ region 827 is formed by dopant out diffusion from substrate 801 during the epitaxial growth of region 805. The n-type collector region 826 can be formed in a lower portion of the semiconductor region 805 by implanting n-type dopants followed by a diffusion process. The p-type base region 825 can be similarly formed by implantation and diffusion in an upper portion of the semiconductor region 805. As required in a bipolar transistor, the based region 825 is adjacent to the emitter region 820. In a specific process, the collector and base regions can be formed before the formation of the MOS transistor.

Figure 8E:
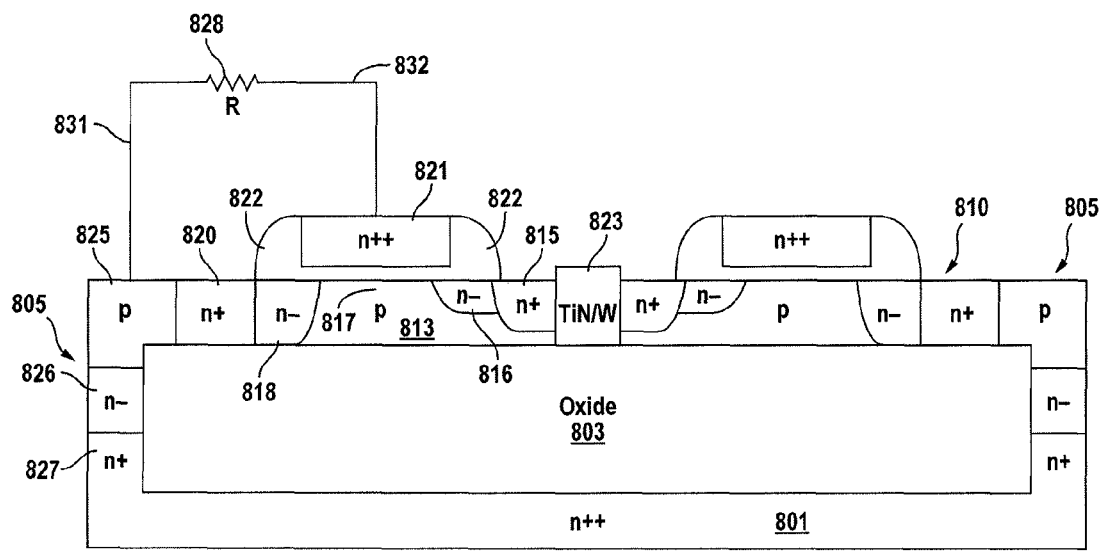

In FIG. 8E, a resistive element 828 is formed overlying the semiconductor substrate and is coupled to the base 825 and to the gate 821. Depending on the embodiment, the resistive element can be formed using various conventional processes. For example, the resistor element can be a diffusion resistor formed in a doped region in the semiconductor layer, a doped polysilicon region, or a metal resistor. After the resistor is formed, conductive lines 831 and 832 can be formed overlying the semiconductor layer for connecting the resistive element to the base and the gate, respectively. These conductive lines can also be fabricated using conventional processes.

In an embodiment, the method also includes forming an electrode 823 coupled to the source region 815. In FIG. 8E, the electrode is shown as a metal region including TiN and/or W. As shown, the source electrode is also coupled to the body region 813. A collector electrode (not shown) can be formed for connection to the substrate 801, which is coupled to the collector region 826 through the n+ region 827. Additionally, a gate electrode (not shown) can be formed and coupled to the gate. In the embodiment shown in the schematic diagram in FIG. 3, the source electrode is used as a ground terminal, the collector electrode is coupled to a power supply Vc, and the gate electrode serves as an input terminal to receive an input voltage Vg.

The above sequence of processes provides a method for forming a composite semiconductor device according to embodiments of the present invention. As shown, the method uses a combination of processes including a way of combining an SOI MOS transistor and a bipolar transistor to form a composite device capable of improved device performance. Other alternatives can also be provided where steps are added, one or more steps are removed, or one or more steps are provided in a different sequence without departing from the scope of the claims herein. Additionally, even though the discussion has been made in the context of an n-type LDMOS and an NPN bipolar transistor, it is understood that the techniques provided herein are applicable to other semiconductor devices as well.

For example, by reversing the polarity of the doped regions, an alternative embodiment can include a combination of a p-type LDMOS and a PNP bipolar transistor. Alternatively, an MOS field effect transistor (MOSFET) on SOI can be used instead of the LDMOS. In one embodiment, the bipolar transistor includes an emitter, a base, and a collector in an L-shaped configuration, as shown in FIG. 2B. In another embodiment, the emitter, base, and collector can be arranged in a vertical configuration. Alternatively, the bipolar transistor can be a lateral transistor with emitter, base, and collector formed in a surface region of a semiconductor substrate.

Figure 8F:
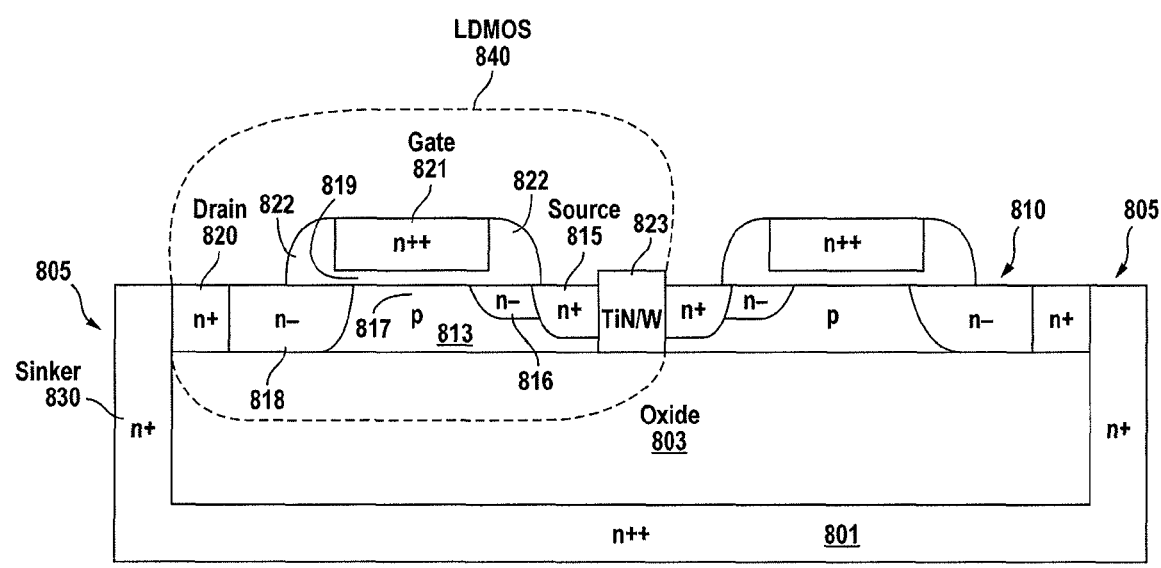

In another embodiment, starting with the device structure in FIG. 8C, an LDMOS on SOI can be formed as shown in FIG. 8F. LDMOS 840 is similar to LDMOS 240 in FIG. 2A. LDMOS 840 and sinker region 830 can be formed using known processes. Some of the processes have been discussed above in connection with FIG. 8D and FIG. 8E. Of course, there can be other variations, modifications, and alternatives. For example, by reversing the polarity of the doped regions, an alternative embodiment can include a combination of a p-type LDMOS and a PNP bipolar transistor. Alternatively, an MOS field effect transistor (MOSFET) instead of the LDMOS can be formed on SOI with a sinker region connecting to the semiconductor substrate.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

What is claimed is:

1. A semiconductor device, comprising:
   a semiconductor substrate of a first conductivity type;
   a dielectric layer disposed on the semiconductor substrate;
   a first semiconductor region disposed on the dielectric layer;
   an MOS transistor, including:
      a source region of the first conductivity type disposed in the first semiconductor region;
      a drain region of the first conductivity type disposed in the first semiconductor region, the drain region being configured to operate as an emitter of a bipolar transistor;
      a body region of a second conductivity type disposed between the drain region and the source region in the first semiconductor region; and
      a gate disposed on a surface portion of the body region, the surface portion of the body region including a channel region of the MOS transistor;
   a second semiconductor region of the first conductivity type disposed on and in direct contact with the semiconductor substrate, the second semiconductor region being configured to operate as a collector of the bipolar transistor;
   a third semiconductor region of the second conductivity type disposed on top of the second semiconductor region, the third semiconductor region being in contact with the drain region of the MOS transistor and configured to operate as a base of the bipolar transistor; and
   a resistive element coupled between the gate and the third semiconductor region.

2. The device of claim 1 further comprising a first electrode coupled to the source region, a second electrode coupled to the semiconductor substrate, and a third electrode coupled to the gate.

3. The device of claim 1 further comprising a ground electrode coupled to the source region, a power electrode coupled to the semiconductor substrate, and an input electrode coupled to the gate.

4. The device of claim 1 wherein an on-resistance of the semiconductor device is lower than an on-resistance of the MOS transistor of the semiconductor device.

5. The device of claim 1 wherein the resistive element includes a resistor disposed on the semiconductor substrate.

6. The device of claim 1 wherein the resistive element includes a doped semiconductor region disposed on the semiconductor substrate.

7. The device of claim 1 wherein the first semiconductor region includes silicon.

8. The device of claim 1 wherein the dielectric layer includes silicon oxide.

9. The device of claim 1 wherein the second semiconductor region includes an epitaxial layer.

10. The device of claim 1 wherein the MOS transistor includes an n-type LDMOS transistor and the bipolar transistor includes an NPN bipolar transistor.

11. The device of claim 1 wherein the MOS transistor includes a p-type LDMOS and the bipolar transistor includes a PNP bipolar transistor.

12. The device of claim 1 wherein the MOS transistor further includes a lightly doped drain region disposed between the drain region and the body region.

13. A semiconductor device, comprising:
   a semiconductor-on-insulator region disposed on a substrate, the semiconductor-on-insulator region including a first semiconductor region overlying disposed on a dielectric region;
   an MOS transistor including:
      a drain region, a body region, and a source region disposed in the first semiconductor region, and
      a gate disposed on, at least, the body region;
   a second semiconductor region disposed on the substrate and in contact with the drain region;
   a third semiconductor region disposed on the substrate, the third semiconductor region being disposed below the second semiconductor region, in direct contact with the substrate and in contact with the second semiconductor region;

a bipolar transistor including the drain region as an emitter, the second semiconductor region as a base, and the third semiconductor region as a collector; and a resistive element coupled between the gate and the base.

14. The device of claim 13 wherein:

the source region is of a first conductivity type;

the drain region is of the first conductivity type;

the body region is of a second conductivity type and is disposed between the source region and the drain region, the second conductivity type being opposite the first conductivity type; and the gate is disposed on a surface portion of the body region, the surface portion of the body region extending between the source region and the drain region to form a channel region of the MOS transistor.

15. The device of claim 14 wherein the second semiconductor region is of the second conductivity type and the third semiconductor region is of the first conductivity type.

16. The device of claim 13 wherein the MOS transistor includes an NMOS transistor and the bipolar transistor includes an NPN bipolar transistor.

17. The device of claim 13 wherein the MOS transistor includes a PMOS transistor and the bipolar transistor includes a PNP bipolar transistor.

18. The device of claim 13 wherein the first semiconductor region includes silicon.

19. The device of claim 13 wherein the dielectric region includes silicon oxide.

20. The device of claim 13 further comprising a first electrode coupled to the source region, a second electrode coupled to the substrate, and a third electrode coupled to the gate.

21. The device of claim 13 further comprising a ground electrode coupled to the source region, a power electrode coupled to the substrate, and an input electrode coupled to the gate.

22. The device of claim 13 wherein an on-resistance of the semiconductor device is lower than an on-resistance of the MOS transistor of the semiconductor device.

* * * * *

UNITED STATES PATENT AND TRADEMARK OFFICE
CERTIFICATE OF CORRECTION

| | |
|---|---|
| PATENT NO. | : 8,541,840 B2 |
| APPLICATION NO. | : 13/028054 |
| DATED | : September 24, 2013 |
| INVENTOR(S) | : James Pan |

It is certified that error appears in the above-identified patent and that said Letters Patent is hereby corrected as shown below:

In the Claims

In column 10, line 58, in claim 13, after "region" delete "overlying".

Signed and Sealed this
Fourth Day of February, 2014

Michelle K. Lee
*Deputy Director of the United States Patent and Trademark Office*